United States Patent [19]
Wang et al.

[11] Patent Number: 5,200,347
[45] Date of Patent: Apr. 6, 1993

[54] METHOD FOR IMPROVING THE RADIATION HARDNESS OF AN INTEGRATED CIRCUIT BIPOLAR TRANSISTOR

[75] Inventors: Jia-Tarng Wang, Cupertino; Robert T. Haraga, San Jose; Wadie N. Khadder, Sunnyvale, all of Calif.

[73] Assignee: Linear Technology Corporation, Milpitas, Calif.

[21] Appl. No.: 655,314

[22] Filed: Feb. 14, 1991

[51] Int. Cl.$^5$ .......................................... H01L 21/265
[52] U.S. Cl. ............................. 437/31; 437/32; 437/225; 437/228; 437/34; 148/DIG. 11; 148/DIG. 50
[58] Field of Search .............. 437/31, 32, 225, 228, 437/229, 166, 34; 148/DIG. 11, DIG. 50, DIG. 116, DIG. 117, DIG. 118

[56] References Cited

U.S. PATENT DOCUMENTS

| | | |
|---|---|---|
| 4,168,997 | 9/1979 | Compton ............................ 437/166 |
| 4,717,680 | 1/1988 | Piotrowski ......................... 437/31 |
| 4,780,425 | 10/1988 | Tabata ............................. 437/166 |
| 4,855,244 | 8/1989 | Hutter et al. ...................... 437/31 |
| 4,855,245 | 8/1989 | Neppl et al. ....................... 437/31 |
| 4,898,837 | 2/1990 | Takeda et al. ..................... 437/27 |
| 4,902,633 | 2/1990 | Cambou ............................. 437/31 |
| 4,939,099 | 7/1990 | Seacrist et al. ................... 437/31 |
| 4,971,929 | 1/1990 | D'Anna et al. ..................... 437/31 |

Primary Examiner—Brian E. Hearn
Assistant Examiner—Kevin M. Picardat
Attorney, Agent, or Firm—Flehr, Hohbach, Test, Albritton & Herbert

[57] ABSTRACT

A method is provided for use with an integrated circuit which includes a npn bipolar transistor on which a variable thickness oxide layer has been formed, the method for improving the radiation hardness of the transistor comprising the steps of: removing the variable thickness oxide layer; and forming a new oxide layer on the transistor, the new oxide layer having less overall volume than the removed variable thickness oxide layer.

21 Claims, 7 Drawing Sheets

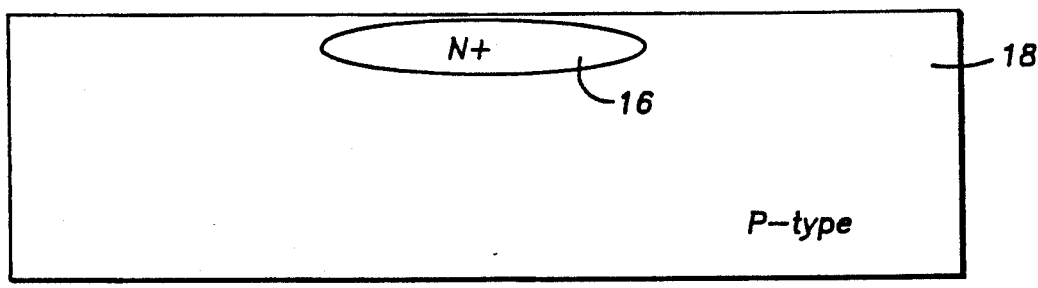
(PRIOR ART)
FIG.—1A
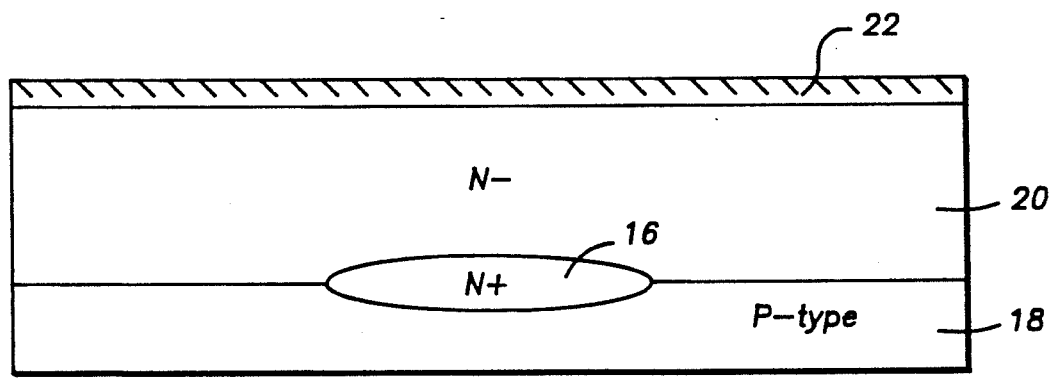
(PRIOR ART)
FIG.—1B
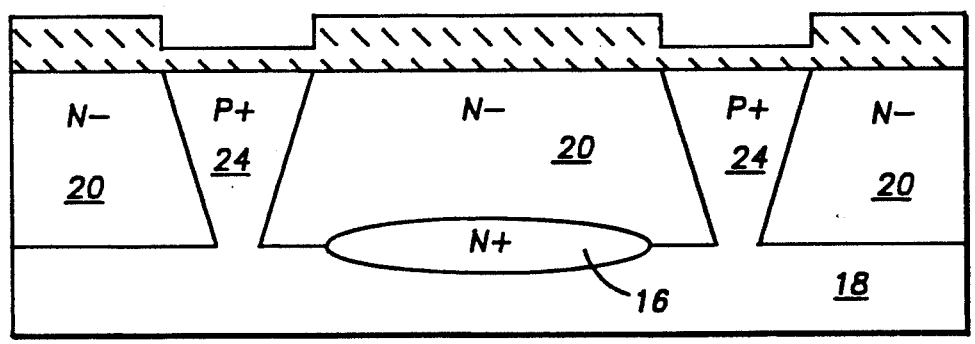
(PRIOR ART)
FIG.—1C

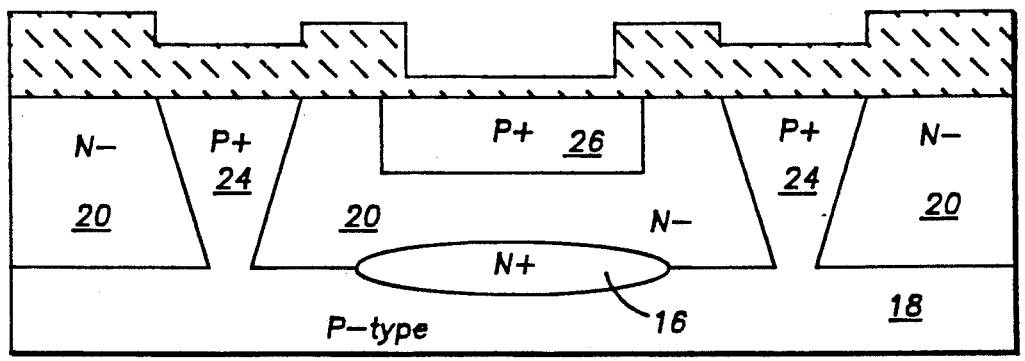
(PRIOR ART)
FIG.—1D
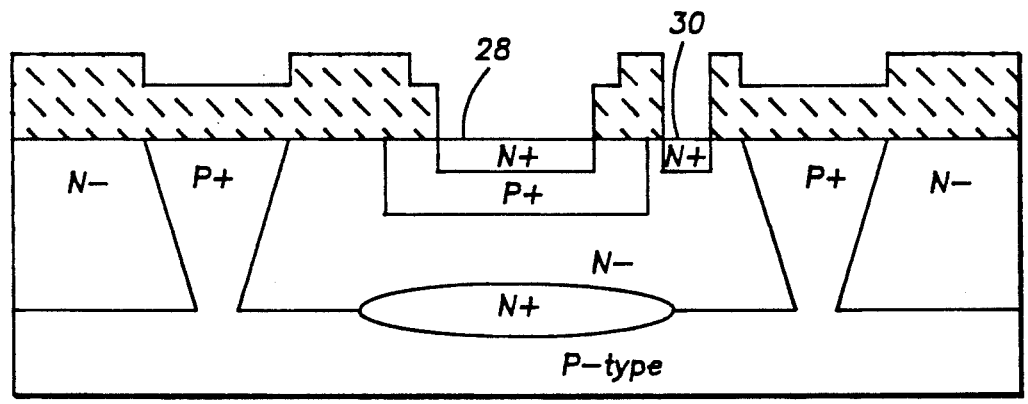
(PRIOR ART)
FIG.—1E
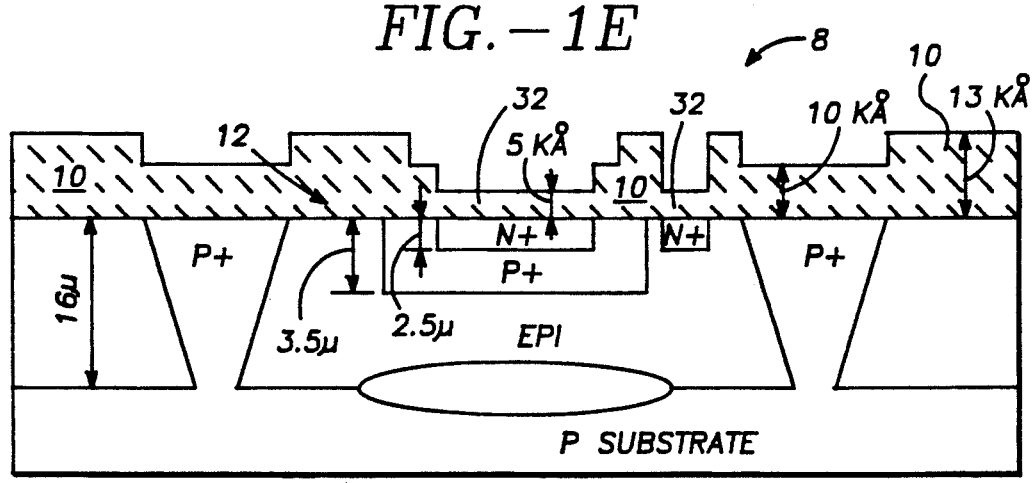
(PRIOR ART)
FIG.—1F

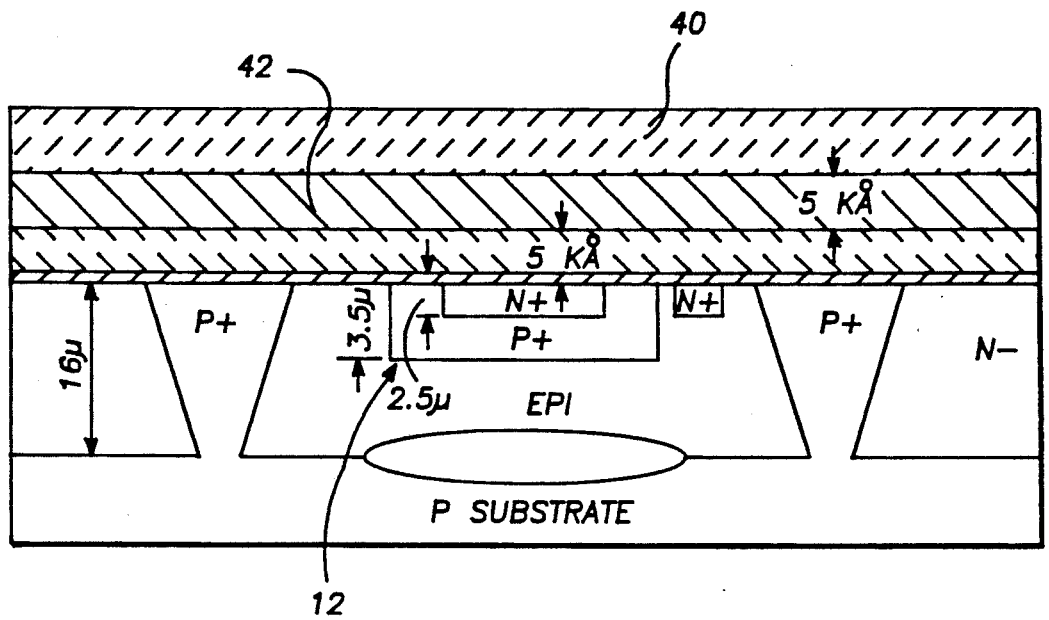
FIG.—3
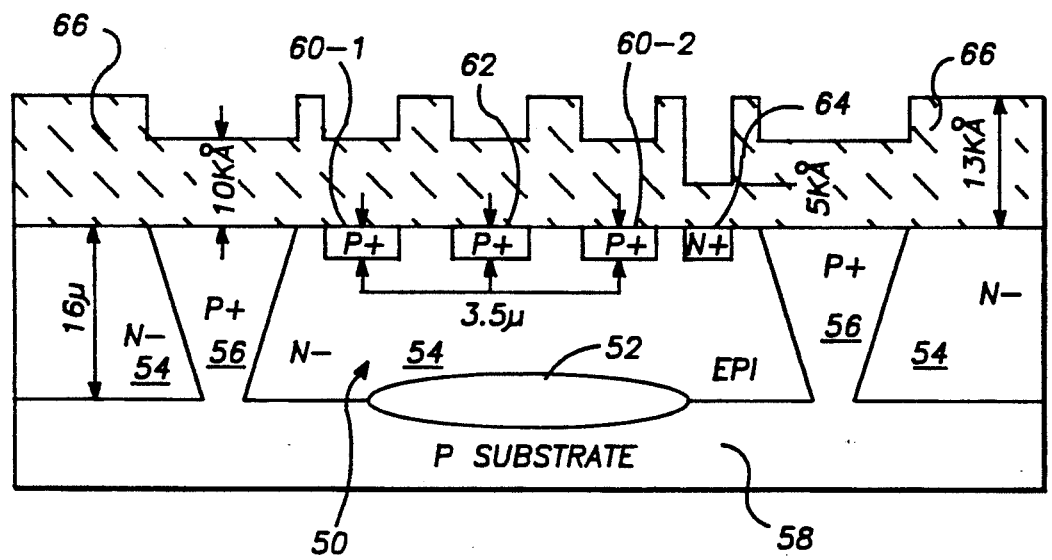
(PRIOR ART)
FIG.—4

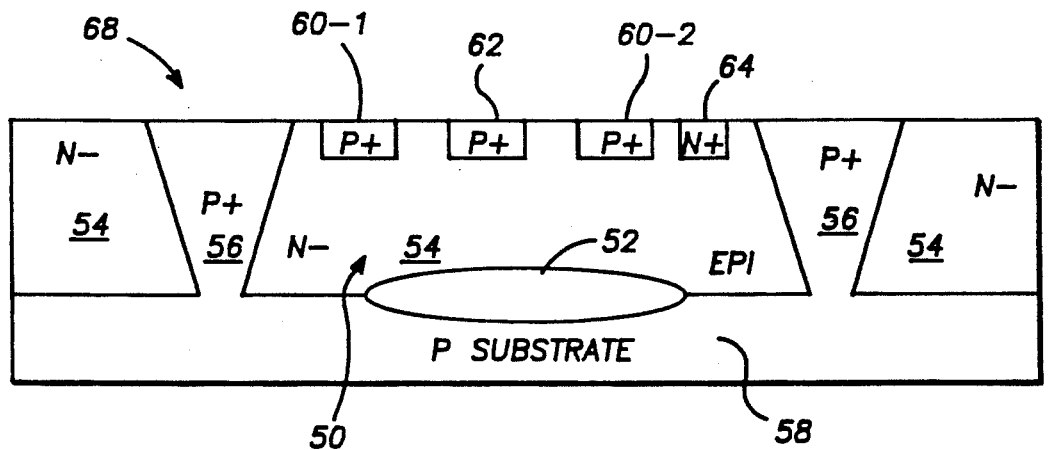
FIG.—5A
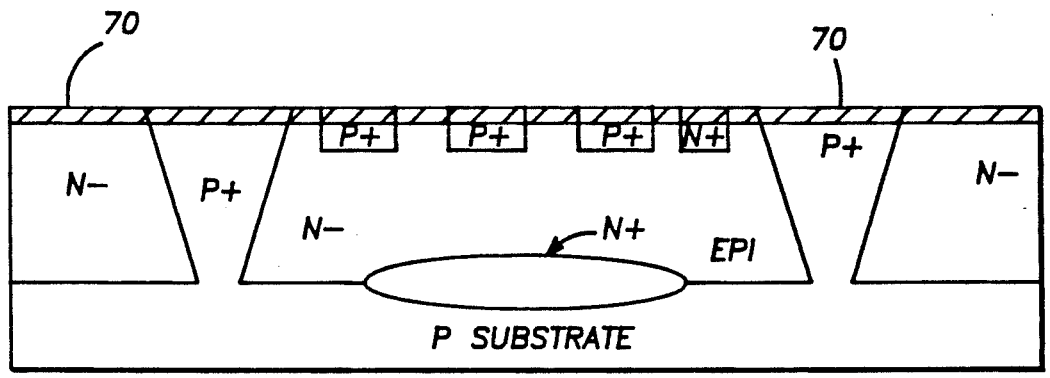
FIG.—5B
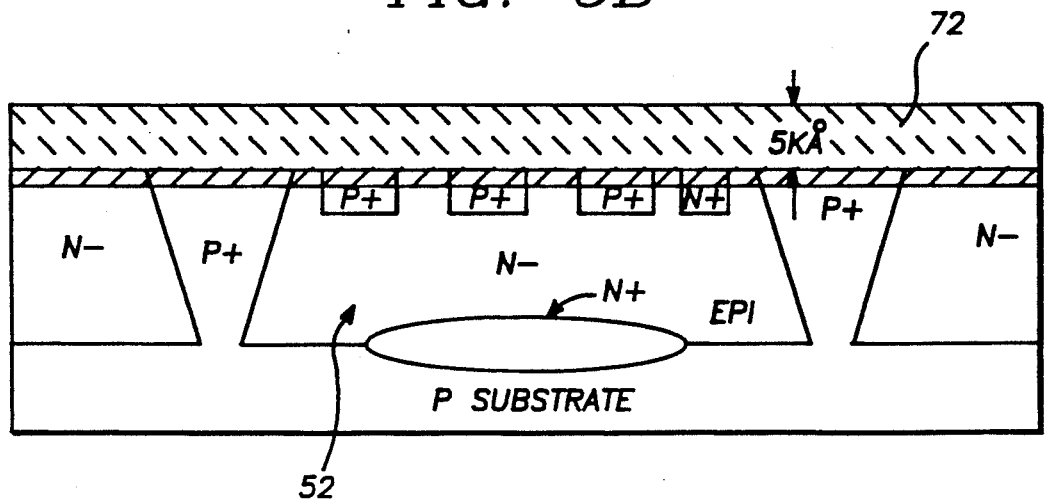
FIG.—5C

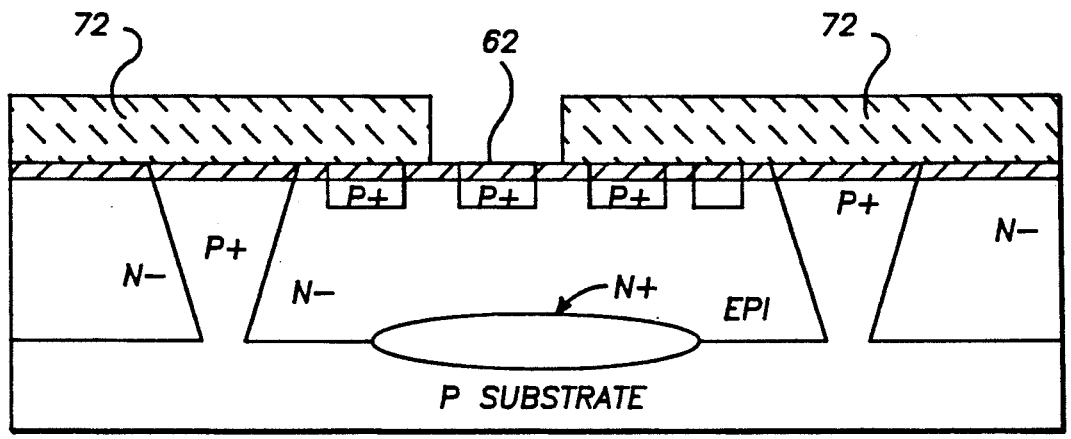
FIG.—5D
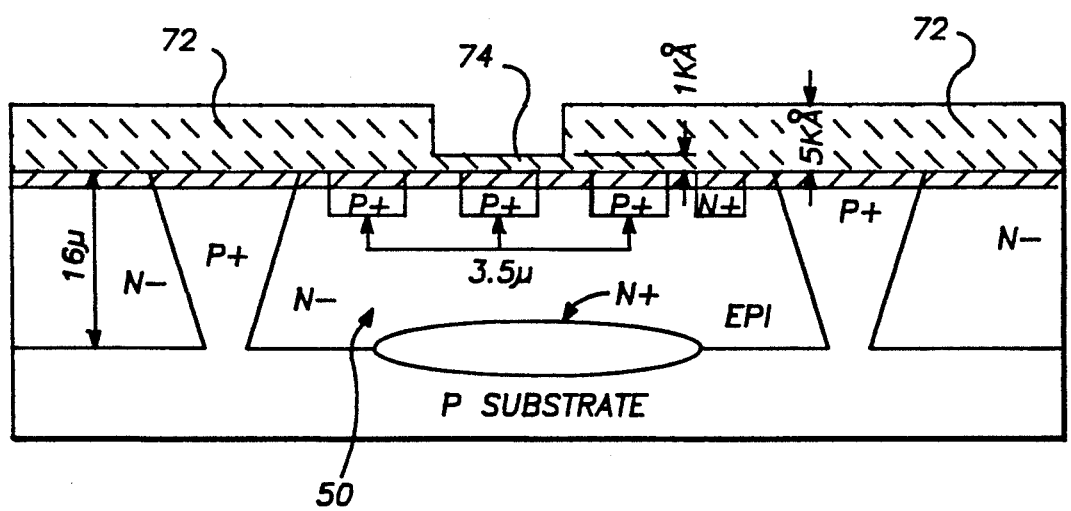
FIG.—5E

METHOD FOR IMPROVING THE RADIATION HARDNESS OF AN INTEGRATED CIRCUIT BIPOLAR TRANSISTOR

BACKGROUND OF THE INVENTION

1. Field of the Invention:

The invention relates generally to the fabrication of integrated circuit bipolar transistors, and more particularly, to a method for improving the radiation hardness of such transistors.

2. Description of the Related Art:

Radiation can degrade the performance of bipolar integrated circuit transistors. For example, exposure of such transistors to high energy x-ray or gamma ray radiation can lead to premature device failure. Radiation damage can occur, for example, as a result of the generation of electron-hole pairs in the passivation oxide and in the glassification which typically is disposed between the passivation oxide and packaging that houses the integrated circuit.

Ordinarily, negatively charged electrons and positively charged holes compensate each other in the oxide and in the glassification. High energy x-ray and gamma ray radiation, however, can produce electron-hole pairs. The electrons can more readily escape from the oxide or the glassification, leaving behind uncompensated positively charged holes. Unfortunately, the presence of such uncompensated positively charged holes can degrade transistor performance.

While earlier integrated circuit bipolar transistors generally have been acceptable, there have been shortcomings with their use. In particular, when such prior transistors are used in radiation intensive environments, such as in spacecraft, their performance often tends to deteriorate due to the presence of uncompensated holes in the oxide or glassification.

Thus, there has been a need for integrated circuit bipolar transistors that have improved resistance to radiation damage. The present invention meets this need.

SUMMARY OF THE INVENTION

The present invention provides a method for improving the radiation hardness of a bipolar transistor. The method involves the step of removing the variable thickness oxide layer which typically overlays a transistor following standard fabrication procedures. After removing the variable thickness layer, a new oxide layer is formed over the transistor. The new oxide layer should have less overall volume than the removed variable thickness oxide layer. Since the new oxide layer has less overall volume than the removed layer, there is less oxide which can serve as a source of uncompensated holes in the event of exposure to high energy radiation. Thus, the transistor is better equipped to withstand energy radiation without suffering significant degradation in its performance.

In another aspect, the invention provides a method for improving the radiation hardness of a pnp bipolar transistor. The method involves the step of removing the variable thickness oxide layer ordinarily formed during standard fabrication steps, and forming a first new oxide layer on the transistor which has less overall volume than the removed oxide layer. A portion of the first new oxide layer which overlays the emitter and partial base region of the transistor is removed. Subsequently, a second new oxide layer, which is thinner than the first new oxide layer, is formed over the emitter and partial base region. The first and second new oxide layers, together, have less overall volume than the removed variable thickness oxide layer.

In still another aspect of the invention, an n-type threshold voltage setting layer is implanted into an exposed surface of the transistor prior to formation of a new lower-volume oxide layer over the transistor. In yet another aspect, the glassification which ordinarily covers the oxide when the transistor is packaged, is kept thin or is omitted altogether, so as to reduce the volume of glassification which can serve as a source of uncompensated holes.

These and other features and advantages of the present invention will become more apparent from the following description of exemplary embodiments thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which:

FIGS. 1a-1f are illustrative drawings showing typical earlier fabrication steps used to produce an npn bipolar transistor; the drawings show illustrative cross-sectional views which depict various regions that comprise the transistor;

FIGS. 2a-2c show cross-sectional views of the transistor during the various steps in the radiation hardening process;

FIG. 3 is an illustrative cross-sectional drawing of the transistor of FIG. 2c covered by a glassification and encased within a housing without metal connection and contact opening;

FIG. 4 is an illustrative cross-sectional drawing of a typical pnp bipolar transistor fabricated in accordance with typical fabrication steps;

FIGS. 5a-5e are illustrative cross-sectional drawings of the transistor of FIG. 4 as the transistor progresses through a radiation hardening process in accordance with the present invention.

DESCRIPTION OF THE PREFERRED EMBODIMENTS

The present invention comprises a novel method for improving the radiation hardness of integrated circuit bipolar transistors. The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded with the widest scope consistent with the principles and features disclosed herein.

Figure 2A:
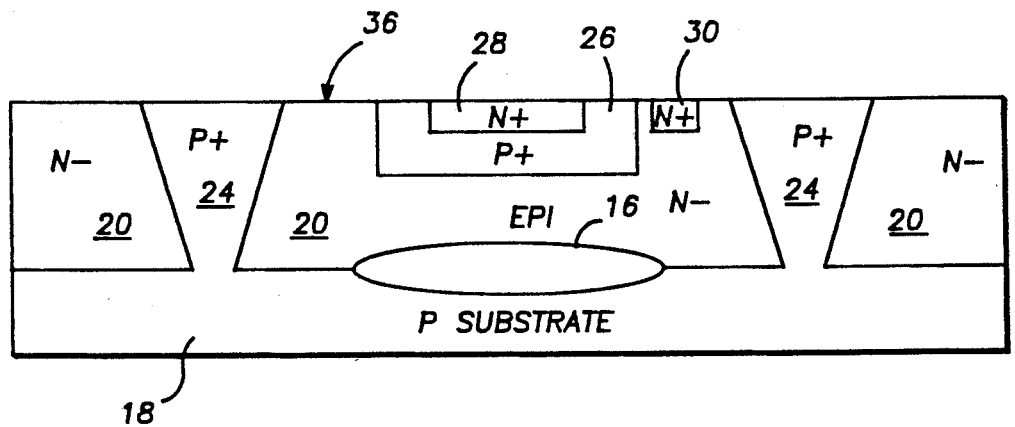
FIGS. 2a-2c illustrate a method, in accordance with the present invention, whereby a transistor fabricated in accordance with the steps of FIGS. 1a-1f can be radiation hardened.
Figure 2B:
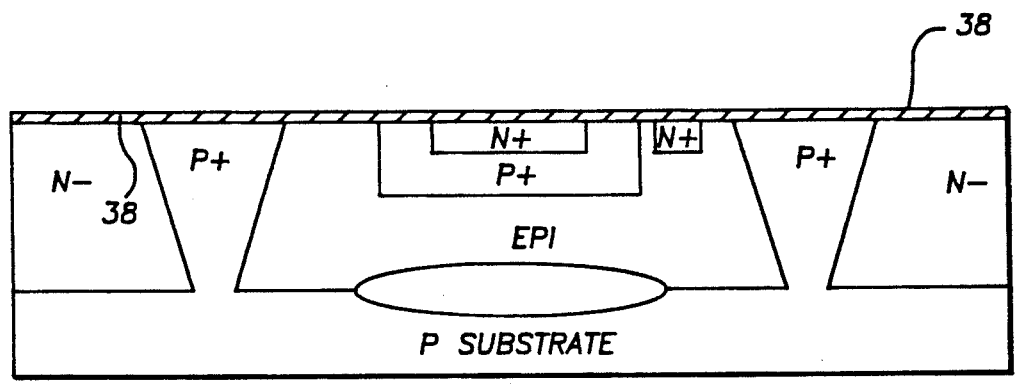
Figure 2C:
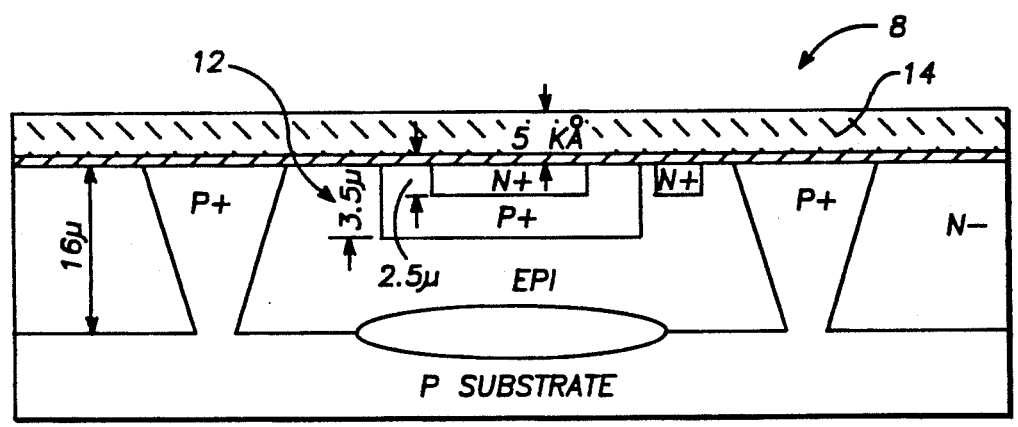

The illustrative drawings of FIGS. 1a–1f depict well-known representative processing steps used to produce integrated circuit npn bipolar transistors. The illustrative drawings of FIGS. 2a–2c show additional processing steps, in accordance with the present invention, which can improve the radiation hardness of an npn bipolar transistor of FIG. 1f. It will be appreciated that there are numerous well known intermediate fabrication steps which are not shown or described herein. These well known steps, however, form no part of the present invention, and the method of the present invention will be understood by one of ordinary skill in the art without a description of such intermediate steps.

Referring to FIG. 1f, there is shown a portion of an integrated circuit 8 in which a variable thickness oxide layer 10 overlays an npn transistor structure 12. In FIG. 2c the same portion of the same integrated circuit 8 is shown after processing in accordance with the present invention. A new uniform thickness oxide layer 14 overlays the transistor 12. The overall volume of the new oxide layer 14 of FIG. 2c is less than the overall volume of the variable thickness oxide layer 10 of FIG. 1f. There is less opportunity for formation of free electron-hole pairs in the new oxide layer 14 than in the variable thickness layer 10 since there is less oxide available in the new layer 14 to serve as a source of such free electron-hole pairs. As a result, the radiation hardness, or resistance to radiation damage, of the transistor 12 is improved through the use of the new thinner oxide layer 14.

A typical earlier process for producing an npn bipolar transistor is described in relation to FIGS. 1a–1f. It will be appreciated that, although one particular process is described herein, other process steps could be employed to produce the transistor 12 of FIG. 1f which is overlain by the variable thickness oxide layer 10. FIG. 1a illustrates the step of producing an N+ buried layer 16 in a p-type substrate 18. The buried layer 16 reduces the saturation voltage of the resultant transistor 12. FIG. 1b illustrates the formation of the N−EPI layer and the formation of EPI reoxidation layer 22. FIG. 1c illustrates the formation of two p+isolation regions 24. FIG. 1d illustrates the formation on the base region 26. FIG. 1e illustrates the formation of the respective emitter and collector contact regions 28 and 30. FIG. 1f illustrates the formation of an oxide passivation layer 32 which overlays the collector and emitter regions 28 and 30 and which forms a part of the variable thickness oxide layer 10.

From the drawings of FIGS. 1a–1f, it will be appreciated that the various fabrication steps involved in the production of a transistor 12 result in an oxide layer 10 which has a variable thickness. The variable thickness is due to the successive additions and removals of oxide during the masking and diffusion steps involved in the fabrication of the various regions of the transistor 12. The representative thicknesses of various portions of the oxide layer 10 and of various regions of the transistor structure 12 is indicated in FIG. 1f. Portions of the oxide layer 10 formed over the emitter region 28 and collector region 30 generally are made thick enough to passivate these regions. In the embodiment of FIG. 1f, the oxide thickness over the emitter region is 5000 Angstroms.

Referring now to FIG. 2a, the entire variable thickness oxide layer 10 is removed, leaving an exposed surface 36 of the transistor 12. Referring to FIG. 2b, an n-type dopant, arsenic in the preferred embodiment, is implanted into the entire exposed surface 36 to form an n-type threshold voltage setting layer 38. In the preferred embodiment, the threshold voltage setting layer 38 has a concentration of approximately $5 \times 10^{16}$ atoms per cubic cm. In FIG. 2c, the new uniform thickness oxide layer 14 is formed over the exposed surface 36. In the preferred embodiment, the thickness of the new oxide layer 14 is 5000 Angstroms. The overall volume of the new oxide layer 14, therefore, is less than the overall volume of the removed variable thickness oxide layer 10. Consequently, there is less oxide available to serve as a source of uncompensated holes due to exposure to high energy radiation. Thus, the transistor 12 of FIG. 2c is radiation hardened as a result of the processing steps shown in FIGS. 2a–2c.

Implanting the n-type threshold setting layer 38 into the exposed surface 36 results in a higher turn-on voltage for the device than otherwise could be achieved with such a thin oxide layer 14. The transistor 12 of FIG. 2c, therefore, advantageously can resist radiation damage through the use of a lower volume thinner oxide layer 14 while still exhibiting a desired turn-on voltage. In the presently preferred embodiment, the turn-on voltage is approximately 40 volts.

It will be appreciated, of course, that additional processing steps are required to render the transistor 12 operational. For example, metal contacts and metal interconnects must be added. These steps form no part of the present invention, are well understood by those skilled in the art, and need not be described in detail herein.

Referring to FIG. 3, the integrated circuit 8 is covered with a glassification 42 which, in the preferred embodiment, comprises low temperature chemical vapor deposited oxide and plasma enhanced nitride. The glassification 42 advantageously makes the circuit more resistant to sodium contamination and helps to prevent electrical shorting between the circuit 8 and the package 40. The package 40 provides a housing without metal connection and contact opening. Unfortunately, exposure of the glassification 42 to radiation can result in the generation of uncompensated positively charged holes in the glassification 42. The presence of such holes can degrade the performance of the transistor structure 12. In order to reduce the potential for such radiation damage, the thickness of the glassification 42 is maintained substantially uniform at 5000 Angstroms of oxide. Alternatively, in applications where the risk of sodium contamination is small, as in spacecraft, the glassification 42 can be omitted altogether from the package 40.

Referring to the illustrative drawings of FIG. 4, there is shown a pnp bipolar transistor 50. Transistor 50 includes an N+ buried layer 52, an N−EPI layer 54 and a P+ isolation regions 56, all of which are formed on a p-type substrate 58. The transistor 50 also includes a collector region 60-1, 60-2 which surrounds an emitter region 62. The transistor 50 also includes a base contact region 64.

A variable thickness oxide layer overlays the transistor 50. The thickness of various regions of the transistor 50 and the thickness of various regions of the oxide 66 are indicated in the drawing of FIG. 4. The transistor 50 is formed using standard well-known fabrication steps. As will be appreciated from the discussion above and the drawings in FIGS. 1a–1f, the variations in the thickness in the oxide 66 result from the steps used to form the various structures of the transistor 50. The steps used to produce the transistor 50 are well known to those skilled in the art and do not form any part of the present invention, and therefore, need not be described herein.

Referring now to the illustrative drawings of FIGS. 5a-5e, there is shown a series of fabrication steps in accordance with the present invention, whereby the transistor 50 can be radiation hardened. In FIG. 5a, the variable thickness oxide layer 66 is removed to expose a surface 68 of the transistor 50. In FIG. 5b an n-type dopant layer 70 is implanted into the exposed surface 68. The layer 70 helps to set the threshold voltage of the transistor 121. In the preferred embodiment, the n-type dopant is arsenic. In FIG. 5c, a first new uniform thickness oxide layer 72 is formed. The first layer 72 has a uniform thickness of 5000 Angstroms. In FIG. 5d a portion of the first new oxide layer 72 is removed from in the vicinity of the emitter 62. In FIG. 5e a second new oxide layer 74 is formed over of the emitter 62. In the presently preferred embodiment, the second new oxide layer 74 has a thickness of 1000 Angstroms. The transistor 50 shown in FIG. 5e is radiation hardened relative to that same transistor 50 shown in FIG. 4 because the overall volume of the first and second new oxide layers, 72, 74 is less than the overall volume of the variable thickness oxide layer 66 shown in FIG. 4. Thus, the oxide layers 72, 74 in FIG. 5e provide a lesser volume of oxide which can serve as a source of uncompensated positively charged holes due to exposure to high energy radiation. Moreover, it has been found that the radiation hardness of the pnp bipolar transistor 50 is improved by using the extra-thinned second new oxide layer 74 to overlay the emitter 62 of the transistor 50.

Figure 6:
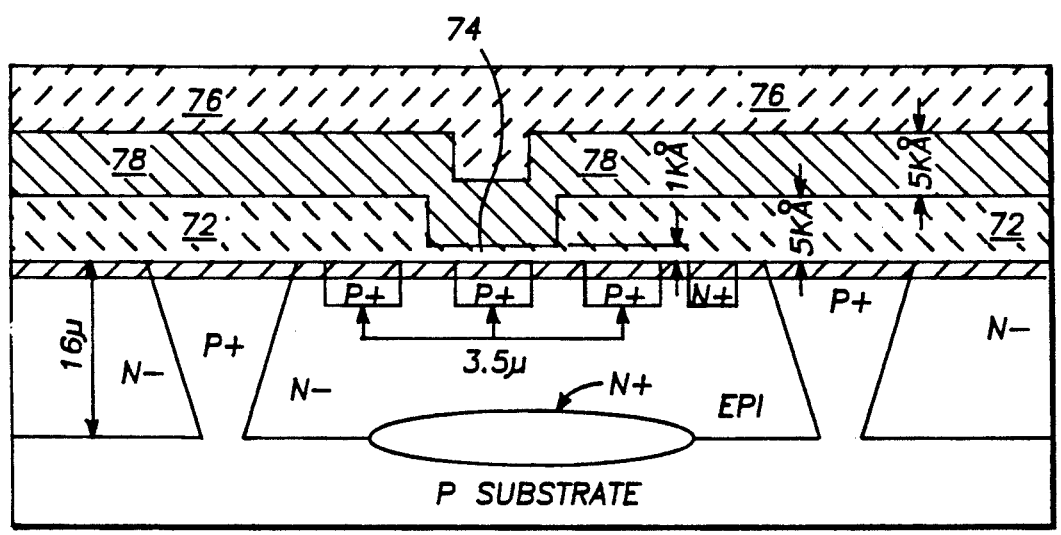
FIG. 6 is an illustrative cross-sectional drawing of the transistor of FIG. 5e covered by glassification and encased within a package, without metal connection and contact opening.

Referring to FIG. 6, the transistor 50 of FIG. 5e is housed in a package 76. In order to avoid sodium contamination, the integrated circuit 49 is covered with a glassification 78 which, in the preferred embodiment, comprises low temperature chemical deposited oxide and plasma enhanced nitride. The glassification 78 advantageously makes the circuit more resistant to sodium contamination and helps to prevent electrical shorting between the transistor 50 and the package 76. In order to reduce the potential for radiation damage due to the formation of uncompensated holes in the glassification 78, the thickness of the glassification is maintained substantially uniform at 5000 Angstroms or less with low temperature chemical deposited oxide.

While a number of embodiments in accordance with the invention have been illustrated and described herein, various alternative embodiments can be employed without departing from the invention.

Thus, the invention is not intended to be limited by the above disclosure, but is to be defined in the appended claims.

What is claimed is:

1. For use with an integrated circuit which includes an npn bipolar transistor on which a variable thickness oxide layer of a first volume has been formed, a method for improving the radiation hardness of the transistor comprising the steps of:
   removing the variable thickness oxide layer; and
   forming a new oxide layer of predefined volume on the transistor, said predefined volume being selected to be less than said first volume so as to reduce the probability of radiation damage to said npn bipolar transistor.

2. The method of claim 1 wherein said step of removing exposes a surface of the transistor, and further including the step of:
   implanting a layer of n-type dopant into the exposed layer.

3. The method of claim 1 wherein said step of removing exposes a surface of the transistor, and further including the step of:
   implanting a layer of arsenic into the exposed layer.

4. The method of claim 1 wherein said step of removing exposes a surface of the transistor, and further including the step of:
   implanting a layer of n-type dopant into the exposed layer;
   wherein impurity concentration of the n-type implant layer and thickness of the new oxide layer are selected to produce a desired field threshold voltage for the transistor.

5. The method of claim 1 wherein the new oxide layer has substantially uniform thickness across the transistor.

6. The method of claim 1 wherein the new oxide layer has a substantially uniform thickness of no more than 5000 angstroms.

7. The method of claim 1 and further including the step of:
   forming a glassification layer which covers the new oxide layer, the glassification layer having a thickness of no more than 5000 Angstroms of low temperature chemical deposited oxide.

8. The method of claim 1 and further including the step of:
   forming a glassification layer which includes low temperature chemical deposited oxide and which covers the new oxide layer, the glassification layer having a thickness of no more than 5000 Angstroms.

9. For use with an integrated circuit which includes an npn transistor on which a variable thickness oxide layer has been formed, a method for improving the radiation hardness of the transistor comprising the steps of:
   removing the variable thickness oxide layer so as to expose a surface of the transistor;
   implanting a threshold voltage setting layer of n-type dopant into the exposed surface;
   forming a new oxide layer on the transistor, the new oxide layer having less overall volume than the removed variable thickness oxide layer.

10. The method of claim 9 and further including the step of;
    forming a glassification layer which covers the new oxide layer, the glassification layer having a thickness of less than 5000 Angstroms of low temperature chemical deposited oxide.

11. For use with an integrated circuit which includes a pnp bipolar transistor on which a variable thickness oxide layer of a first volume has been formed, a method for improving the radiation hardness of the transistor comprising the steps of:
    removing the variable thickness oxide layer; and
    forming a first new oxide layer of predefined volume on the transistor, said predefined volume being selected to be less than said first volume so as to reduce the probability of radiation damage to said npn bipolar transistor.

12. The method of claim 11 and further including the step of:

removing a portion of the first new oxide layer that overlays an emitter and partial base region of the transistor;

forming a second new oxide layer over the emitter and partial base region, such that a thickness of the second new oxide layer is less than a thickness of the first new oxide layer.

13. The method of claim 11 wherein the first new oxide layer is no more than 5000 angstroms thick and further including the steps of:

removing a portion of the first new oxide layer that overlays an emitter and partial base region of the transistor;

forming a second new oxide layer over the emitter and partial base region, such that the thickness of the second new oxide layer is no more than 1000 Angstroms thick.

14. The method of claim 11 or 12 wherein said step of removing the variable thickness oxide layer exposes a surface of the transistor, and further including the step of:

implanting a layer of n-type dopant into the exposed layer.

15. The method of claim 11 or 12 wherein said step of removing the variable thickness oxide layer exposes a surface of the transistor, and further including the step of:

implanting a layer of arsenic into the exposed layer.

16. The method of claim 11 or 12 wherein said step of removing the variable thickness oxide layer exposes a surface of the transistor, and further including the step of:

implanting a layer of n-type dopant into the exposed layer;

wherein an impurity concentration of the n-type implant layer and a thickness of the first new oxide layer are selected to produce a desired field threshold voltage for the transistor.

17. The method of claim 11 and further including the step of:

forming a glassification layer which covers the first new oxide layer, the glassification layer having a thickness of no more than 5000 Angstroms.

18. The method of claim 12 and further including the step of:

forming a glassification layer which covers the first new oxide layer and the second new oxide layer, the glassification layer having a thickness of no more than 5000 Angstroms.

19. For use with an integrated circuit which includes a pnp transistor on which a variable thickness oxide layer has been formed, a method for improving the radiation hardness of the transistor comprising the steps of:

removing the variable thickness oxide layer so as to expose a surface of the transistor;

implanting a threshold voltage setting layer of n-type dopant into the exposed surface;

forming a first new oxide layer on the transistor, the first new oxide layer having a substantially uniform thickness;

removing a portion of the first new oxide layer that overlays an emitter region of the transistor;

forming a second new oxide layer over the emitter and partial base region, such that a thickness of the second new oxide layer is less than the thickness of the first new oxide layer and such that the first and second new oxide layers together have less overall volume than the removed variable thickness oxide layer.

20. The method of claim 19 wherein the first new oxide layer has a thickness of no more than 5000 Angstroms; and wherein the second new oxide layer has a thickness of no more than 1000 Angstroms.

21. The method of claim 19 and further including the step of:

forming a glassification layer which covers the first new oxide layer and the second new oxide layer, the glassification layer having a thickness of no more than 5000 Angstroms.

* * * * *